United States Patent [19]

Kohashi et al.

[11] Patent Number: 4,609,411

[45] Date of Patent: Sep. 2, 1986

[54] LIQUID-PHASE EPITAXIAL GROWTH METHOD OF A IIIB-VB GROUP COMPOUND

[75] Inventors: Yasuji Kohashi, Tsuchiura; Toshio Ishiwatari, Abiko; Hisanori Fujita, Ibaraki, all of Japan

[73] Assignees: Mitsubishi Monsanto Chemical Co., Ltd.; Mitsubishi Chemical Industries, Ltd., both of Tokyo, Japan

[21] Appl. No.: 694,683

[22] Filed: Jan. 25, 1985

[30] Foreign Application Priority Data

Jan. 27, 1984 [JP] Japan ................................ 59-13080

[51] Int. Cl.$^4$ .......................................... H01L 21/208
[52] U.S. Cl. .................................... 148/171; 148/172; 29/569 L; 29/576 E
[58] Field of Search ............. 148/171, 172; 29/576 E, 29/569 L

[56] References Cited

U.S. PATENT DOCUMENTS

| | | | |
|---|---|---|---|
| 3,897,281 | 7/1975 | Gilbert et al. | 148/171 |
| 4,088,514 | 5/1978 | Hara et al. | 148/171 |
| 4,342,148 | 8/1982 | Springthorpe et al. | 29/569 L |
| 4,507,157 | 3/1985 | Oliver | 148/171 |
| 4,540,450 | 9/1985 | Hawrylo | 148/171 |

*Primary Examiner*—George T. Ozaki
*Attorney, Agent, or Firm*—Burgess, Ryan & Wayne

[57] ABSTRACT

The reproducibility of Te doping in III-V group compounds is improved by using as the dopant a III-V group compound containing Te at a concentration of at least $1 \times 10^{17}$ cm$^{-3}$.

7 Claims, No Drawings

LIQUID-PHASE EPITAXIAL GROWTH METHOD OF A IIIB-VB GROUP COMPOUND

BACKGROUND OF THE INVENTION

1. Field of the Invention

The present invention relates to a liquid-phase epitaxial growth method of an inorganic compound consisting of a IIIb group element(s) and a Vb group element(s) of the Periodic Table (hereinafter referred to as a III-V group compound). More particularly, the present invention relates to a doping method of tellurium (Te) in the liquid-phase epitaxial growth method of a III-V group compound.

2. Description of the Related Art

Such III-V group compounds as GaAs, GaP, $GaAs_{1-x}P_x$, $Ga_{1-x}Al_xAs$, and the like are used for the production of semiconductor elements, such as a light-emitting diode, a semiconductor LASER, and an FET. These semiconductor elements, particularly the light-emitting diode and the semiconductor LASER, are produced by using an epitaxial wafer, in which a thin film of the above-mentioned III-V group compounds is formed on a single crystalline substrate by means of the liquid-phase epitaxial growth method. In order to form an n-type epitaxial layer, one of Te and other n-type impurities is used as a dopant.

Conventionally, Te doping is carried out during liquid-phase epitaxial growth by directly incorporating the element Te into the melt for epitaxial growth (c.f. for example J. Nishizawa et al. Journal of Applied Physics 54(1983).5.P2807). However, according to the conventional method of directly incorporating the element Te into the melt for epitaxial growth, it is difficult to control the doping amount of Te because Te floats on the Ga melt and thus vapourizes, and, further the dopants in a trace amount is difficult to measure. Thus, epitaxial wafers having a requisite concentration of the n-type carrier cannot be produced with a high reproducibility.

SUMMARY OF THE INVENTION

It is an object of the present invention to provide a liquid-phase epitaxial growth method of the III-V group compound, wherein the doping amount of Te is controlled with an improved reproducibility.

In accordance with the objects of the present invention, there is provided a method for epitaxially growing a single crystalline film of a Te-doped III-V group compound on a single crystalline substrate by means of liquid-phase epitaxial growth, characterized in that the Te source used for the doping consists of a single crystalline or polycrystalline III-V compound which comprises at least one component of said single crystalline film and which contains Te at a concentration of at least $1 \times 10^{17}$ cm$^{-3}$.

The III-V group compound used for the single crystalline film includes GaAs, GaP, InP, InAs, or the like, as well as mixed crystals thereof, i.e., $GaAs_{1-x}P_x$, $Ga_{1-x}Al_xAs$, $Ga_{1-x}In_xAs$, and $Ga_{1-x}In_xAs_{1-y}P_y$ ($0 < x, y < 1$).

GaAs, GaP, and other single crystals are used for the single crystalline substrate. The single crystalline substrate preferably has a {100} plane at the surface thereof.

The III-V compound used as the Te source preferably has the components of the single crystalline film which is formed on the single crystalline substrate by means of the liquid-phase epitaxial method. That is, the III-V compound used as the Te source preferably has the same components as the III-V compound of the epitaxially grown film. The III-V compound used as the Te source may be single crystalline or polycrystalline. More preferably, the III-V compound used as the Te source has the same composition as the III-V compound of the epitaxially grown film. That is, when GaAs is to be epitaxially grown as a single crystalline film, GaAs is used as the III-V compound of the Te source and when GaP is to be epitaxially grown as a single crystalline film, GaP is used as the III-V compound of the Te source.

When mixed crystals, such as $Ga_{1-x}Al_xAs$ and $GaAs_{1-x}P_x$, are to be epitaxially grown as a single crystalline film, a III-V group compound, which is one crystal component of the mixed crystals, is preferably used, in the form of a single crystal or polycrystal, as the Te source. GaAs is used as the Te source when epitaxially growing $GaAs_{1-x}P_x$ and GaAs or GaP is used as the Te source when epitaxially growing $GaAs_{1-x}P_x$.

The Te concentration of the Te source at least $1 \times 10^{17}$ cm$^{-3}$, preferably $1 \times 10^{18}$ cm$^{-3}$. If the concentration of the Te source is less than $1 \times 10^{17}$ cm$^{-3}$, a requisite Te concentration in the single crystalline film cannot be provided, even if a large amount of the Te source is added to the melt of liquid-phase epitaxial growth. The highest Te concentration of the Te source is not specifically limited, provided that Te is uniformly dispersed in the Te source.

Te is added to the polycrystalline or single crystalline Te source by utilizing a known boat growth method of the III-V group compound. This method allows the addition of the element Te to the III-V group compound at an excellent reproducible concentration.

The Te source is added to the melt of liquid-phase epitaxial growth at an amount required for obtaining the Te concentration in the III-V group compound of the epitaxially grown film. The melt mentioned above is then subjected to a usual liquid-phase epitaxial growth method. For example, when a single crystalline $Ga_{1-x}Al_xAs$ film is to be grown, the Ga melt containing a predetermined amount of Al, GaAs, and GaAs with added Te is cooled by using a known liquid-phase epitaxial growth apparatus.

In an embodiment according to the present invention is included the following steps:

preparing a solution for epitaxially growing the III-V group compound;

preparing a liquid-phase epitaxial growth apparatus comprising at least one melt reservoir and a holding part of the single crystalline substrate;

placing the single crystalline substrate in the holding part of the liquid-phase epitaxial growth apparatus;

loading into the melt reservoir the solution and the Te source in a predetermined amount for obtaining an n-type carrier concentration;

cooling at a predetermined cooling rate, the solution containing the Te source while the solution is in contact with the single crystalline substrate, thereby forming an n-type layer of the III-V group compound having a uniform n-type carrier concentration along the depth thereof.

According to a preferred embodiment of the present invention, the above-described steps are repeated while maintaining the process conditions, including the predetermined amount of the Te source and the cooling rate, identical thereby obtaining an n-type carrier concentration which is essentially the same at each repetition.

The method according to the present invention attains, in liquid-phase epitaxial growth, a high reproducibility control of the Te concentration and a uniform Te concentration in the single crystalline film. The yield of the III–V group compound epitaxial wafers is therefore improved. In addition, the efficiency of the light-emitting diodes is enhanced by using the wafers produced by the method of the present invention.

The present invention is further explained by way of an example and a comparative example.

EXAMPLE

A substrate made of a p-type GaAs single crystal, the (100) plane of which crystal was mirror-polished, was prepared. The p-type carrier concentration of the substrate was $1.5 \times 10^{19}$ cm$^{-3}$. A first solution used for liquid-phase epitaxial growth of the first epitaxial layer was prepared by dissolving in 100 g of Ga 6.0 g of polycrystalline GaAs, 2.1 g of Al, and 0.25 g of Zn (metallic Zn as a dopant). A second solution used for liquid-phase epitaxial growth of the second epitaxial layer was prepared by dissolving in 100 g of Ga 1.8 g of undoped GaAs, 0.43 g of Al, and 0.8 g of the Te source. The Te source was preliminarily produced by the boat growth method and was polycrystalline GaAs in which $1 \times 10^{19}$ cm$^{-3}$ of Te was doped.

The above-described first and second solutions were contained in the melt reservoirs of a slide-type liquid-phase epitaxial growth boat. The above-described GaAs substrate was mounted in the holding part of the slide-type boat. The melt reservoirs were first positioned so that they would not come into contact with the GaAs substrate, and the temperature of the boat was elevated to 900° C. under a hydrogen stream. Then the first solution, i.e., the Zn-containing melt for the growth of a p-type Ga$_{1-x}$Al$_x$As, was brought into contact with the GaAs substrate and cooling was initiated at a rate of 0.5° C./min until a temperature of 860° C. was attained. A p-type Ga$_{1-x}$Al$_x$As layer 32 μm in thickness was epitaxially grown on the GaAs substrate. The boat was operated at 860° C. to isolate the first solution from the GaAs substrate and to bring the second solution, i.e., the Te source-containing melt for the growth of an n-type crystal, into contact with the n-type Ga$_{1-x}$Al$_x$As layer. The temperature was then lowered to 810° C. at a cooling rate of 0.5° C./min to epitaxially grow an n-type Ga$_{1-x}$Al$_x$As layer 32 μm in thickness on the GaAs substrate. The second solution was then separated from the GaAs substrate, and the boat was allowed to cool.

The obtained epitaxial wafer had a p-type carrier concentration of $4.2 \times 10^{17}$ cm$^{-3}$ in the 32 μm-thick lower Ga$_{1-x}$Al$_x$As layer and an n-type carrier concentration of $2.3 \times 10^{17}$ cm$^{-3}$ in the 32 μm-thick upper Ga$_{1-x}$Al$_x$As layer. The "x" value of the n-type Ga$_{1-x}$Al$_x$As was 0.71 in the vicinity of the pn junction. For measuring the distribution of the n-type carrier along the depth of the n-type Ga$_{1-x}$Al$_x$As layer, steps were formed on the layer by step etching. The n-type carrier concentration on each of the steps was $2.3 \times 10^{17}$ cm$^{-3}$ and exhibited a virtually flat distribution along the depth of the n-type Ga$_{1-x}$Al$_x$As layer.

The wafer produced as described above was used for the production of light-emitting diodes having no epoxy resin coating. The emission output of the light-emitting diodes was 3.5 milli candela (mcd) at a current density of 8 A/cm$^2$. The peak-emission wavelength was 660 nm.

The above-described production of a wafer and light-emitting diodes was repeated ten times. The n-type carrier concentration was virtually $2 \times 10^{17}$ at each production, thus confirming that the n-type carrier concentration can be controlled with a good reproducibility. The emitting characteristics of the light-emitting diodes were of an improved reproducibility. In addition, the light-emitting diodes were brighter than conventional light-emitting diodes.

COMPARATIVE EXAMPLE

A substrate made of a p-type GaAs single crystal, the (100) plane of which crystal was mirror-polished, was prepared. The p-type carrier concentration of the substrate was $1.5 \times 10^{19}$ cm$^{-3}$. A first solution used for liquid-phase epitaxial growth of the first epitaxial layer was prepared by dissolving in 100 g of Ga 6.0 g of undoped polycrystalline GaAs, 2.1 g of Al, and 0.25 g of Zn (metallic Zn as a dopant). A second solution used for liquid-phase epitaxial growth of the second epitaxial layer was prepared by dissolving in 100 g of Ga 1.8 g of undoped GaAs, 0.43 g of Al, and 0.25 mg of the element Te.

The above-described first and second solutions were contained in the melt reservoirs of a slide-type liquid-phase epitaxial growth boat. The above-described GaAs substrate was mounted in the holding part of the slide-type boat. The melt reservoirs were first positioned so that they would not come into contact with the GaAs substrate, and the temperature of the boat was elevated to 900° C. under a hydrogen stream. Then the first solution, i.e., the Zn-containing melt for the growth of a p-type Ga$_{1-x}$Al$_x$As, was brought into contact with the GaAs substrate and cooling was initiated at a rate of 0.5° C./min until a temperature of 860° C. was attained. A p-type Ga$_{1-x}$Al$_x$As layer 30 μm in thickness was epitaxially grown on the GaAs substrate. The boat was operated at 860° C. to isolate the first solution from the GaAs substrate and to bring the second solution, i.e., the Te source-containing melt for the growth of an n-type crystal, into contact with the n-type Ga$_{1-x}$Al$_x$As layer. The temperature was then lowered to 810° C. at a cooling rate of 0.5° C./min to epitaxially grow an n-type Ga$_{1-x}$Al$_x$As layer 23 μm in thickness on the GaAs substrate. The second solution was then separated from the GaAs substrate, and the boat was allowed to cool.

The obtained epitaxial wafer had a p-type carrier concentration of $3.9 \times 10^{17}$ cm$^3$ in the 30 μm-thick lower Ga$_{1-x}$Al$_x$As layer and an n-type carrier concentration of $2.3 \times 10^{17}$ cm$^{-3}$ in the 23 μm-thick upper Ga$_{1-x}$Al$_x$As layer. The "x" value of the n-type Ga$_{1-x}$Al$_x$As was 0.70 in the vicinity of the pn junction. For measuring the distribution of the n-type carrier along the depth of the n-type Ga$_{1-x}$Al$_x$As layer, steps were formed on the layer by step etching. The n-type carrier concentration distribution varied from $7 \times 10^{16}$ to $1 \times 10^{17}$ along the depth of the n-type Ga$_{1-x}$Al$_x$As layer and was $9 \times 10^{16}$ cm$^{-3}$ at the center of the layer.

The wafer produced as described above was used for the production of light-emitting diodes having no epoxy resin coating. The emission output of the light-emitting diodes was 1.1 mcd at a current density of 8 A/cm$^2$. The peak-emission wavelength was 660 nm.

The above-described production of a wafer and light-emitting diodes was repeated ten times. Most of the surface parts of the wafers had an n-type carrier concentration on the order of $10^{16}$ cm$^{-3}$. A carrier concentration of $1.5 \times 10^{17}$ cm$^{-3}$ was detected only locally. Both the n-type carrier concentration along the depth of the n-type $Ga_{1-x}Al_xAs$ layer and the emission output greatly varied. Uniform control of the n-type carrier concentration along the depth of the n-type $Ga_{1-x}Al_xAs$ layer was not attained despite strict uniform control of the above-described process parameters of liquid-phase epitaxial growth.

We claim:

1. A method for epitaxially growing a single crystalline film of a Te-doped III-V group inorganic compound consisting of a IIIb group element and a Vb group element of the Periodic Table on a single crystalline substrate by means of liquid-phase epitaxial growth, characterized in that a Te source for doping consists of a single crystalline or polycrystalline III-V compound of said single crystalline film and which contains Te at a concentration of at least $1 \times 10^{17}$ cm$^{-3}$.

2. A method according to claim 1, wherein said Te source consists of polycrystalline GaAs containing at least $1 \times 10^{17}$ cm$^{-3}$ of Te and said III-V group inorganic compound is at least one member selected from the group consisting of GaAs, $GaAs_{1-x}P_x(1>x>0)$, and $Ga_{1-x}Al_xAs(1>x>0)$.

3. A method according to claim 1 or 2, wherein said single crystalline substrate consists of GaAs.

4. A method according to claim 1, wherein said Te source consists of polycrystalline GaAs containing at least $1 \times 10^{17}$ cm$^{-3}$ of Te and said III-V group inorganic compound is at least one member selected from the group consisting of GaP and $GaAs_{1-x}P_x(1>x>0)$.

5. A method according to claim 4, wherein said single crystalline substrate consists of GaP.

6. A method for epitaxially growing a single crystalline film of a Te-doped III-V group inorganic compound which consists of a IIIb group element and a Vb group element of the Periodic Table on a single crystalline substrate by means of liquid-phase epitaxial growth, comprising the steps of:

preparing, by means of a boat growth method, a Te source for doping, said Te source consisting of a single crystalline or polycrystalline III-V compound which comprises at least one component of said single crystalline film and which contains Te at a concentration of at least $1 \times 10^{17}$ cm$^{-3}$;

preparing a solution for epitaxially growing said III-V group compound;

preparing a liquid-phase epitaxial growth apparatus comprising at least one melt reservoir and a holding part of said single crystalline substrate;

placing said single crystalline substrate in said holding part of the liquid-phase epitaxial growth apparatus;

loading into said melt reservoir said solution and said Te source in a predetermined amount for obtaining an n-type carrier concentration; and cooling, at a predetermined cooling rate, said solution containing said Te source while said solution is in contact with said single crystalline substrate, thereby forming an n-type layer of said III-V group compound having a uniform n-type carrier concentration along a depth thereof.

7. A method according to claim 6, wherein said steps are repeated while maintaining the process conditions, including the predetermined amount of the Te source and the cooling rate, identical, thereby obtaining an n-type carrier concentration which is essentially the same at each repetition.

* * * * *